(12) United States Patent
Bartkowiak et al.

(10) Patent No.: US 9,746,510 B2
(45) Date of Patent: Aug. 29, 2017

(54) GROUND-FAULT DETECTOR FOR MULTIFURNACE INSTALLATION

(71) Applicant: ABP INDUCTION SYSTEMS GMBH, Dortmund (DE)

(72) Inventors: Matthias Bartkowiak, Dortmund (DE); Christoph Forsthoevel, Dortmund (DE); Daniel Green, Clark, NJ (US)

(73) Assignee: ABP INDUCTION SYSTEMS GMBH, Dortmund (DE)

(*) Notice: Subject to any disclaimer, the term of this patent is extended or adjusted under 35 U.S.C. 154(b) by 156 days.

(21) Appl. No.: 14/440,606

(22) PCT Filed: Nov. 7, 2013

(86) PCT No.: PCT/DE2013/000660
§ 371 (c)(1),
(2) Date: May 5, 2015

(87) PCT Pub. No.: WO2014/071912
PCT Pub. Date: May 15, 2014

(65) Prior Publication Data
US 2015/0301098 A1    Oct. 22, 2015

(30) Foreign Application Priority Data

Nov. 9, 2012  (DE) .................. 10 2012 021 903
Feb. 19, 2013  (DE) .................. 10 2013 002 796

(51) Int. Cl.
| | | |
|---|---|---|
| *G01R 31/02* | (2006.01) |
| *F27B 14/20* | (2006.01) |
| *F27D 19/00* | (2006.01) |
| *F27D 21/00* | (2006.01) |
| *F27D 99/00* | (2010.01) |
| *H05B 6/06* | (2006.01) |
| *H05B 6/28* | (2006.01) |

(52) U.S. Cl.
CPC ............ *G01R 31/025* (2013.01); *F27B 14/20* (2013.01); *F27D 19/00* (2013.01); *F27D 21/00* (2013.01); *F27D 99/0006* (2013.01); *H05B 6/067* (2013.01); *H05B 6/28* (2013.01); *F27D 2099/0015* (2013.01); *Y02P 10/253* (2015.11)

(58) Field of Classification Search
USPC .......................... 324/509–511; 219/660–665
See application file for complete search history.

(56) References Cited

U.S. PATENT DOCUMENTS 6,163,019 A * 12/2000 Green ............... H02M 7/53873
219/660

FOREIGN PATENT DOCUMENTS

EP    1818638 A    8/2007

* cited by examiner

*Primary Examiner* — Vincent Q Nguyen
(74) *Attorney, Agent, or Firm* — Andrew Wilford

(57) ABSTRACT

An apparatus for detecting ground faults in a multifurnace installation with at least two induction furnaces and a multifurnace installation are described. A ground-fault sensor is associated with each induction furnace and is connected to the electrical supply line to the induction furnace coil. Furthermore, the apparatus has a ground-leak sensor. Moreover, the apparatus includes an additional ground-fault sensor that measures at the same location as the ground-leak sensor. In this manner an improvement of security during the operation of the system is obtained.

8 Claims, 1 Drawing Sheet

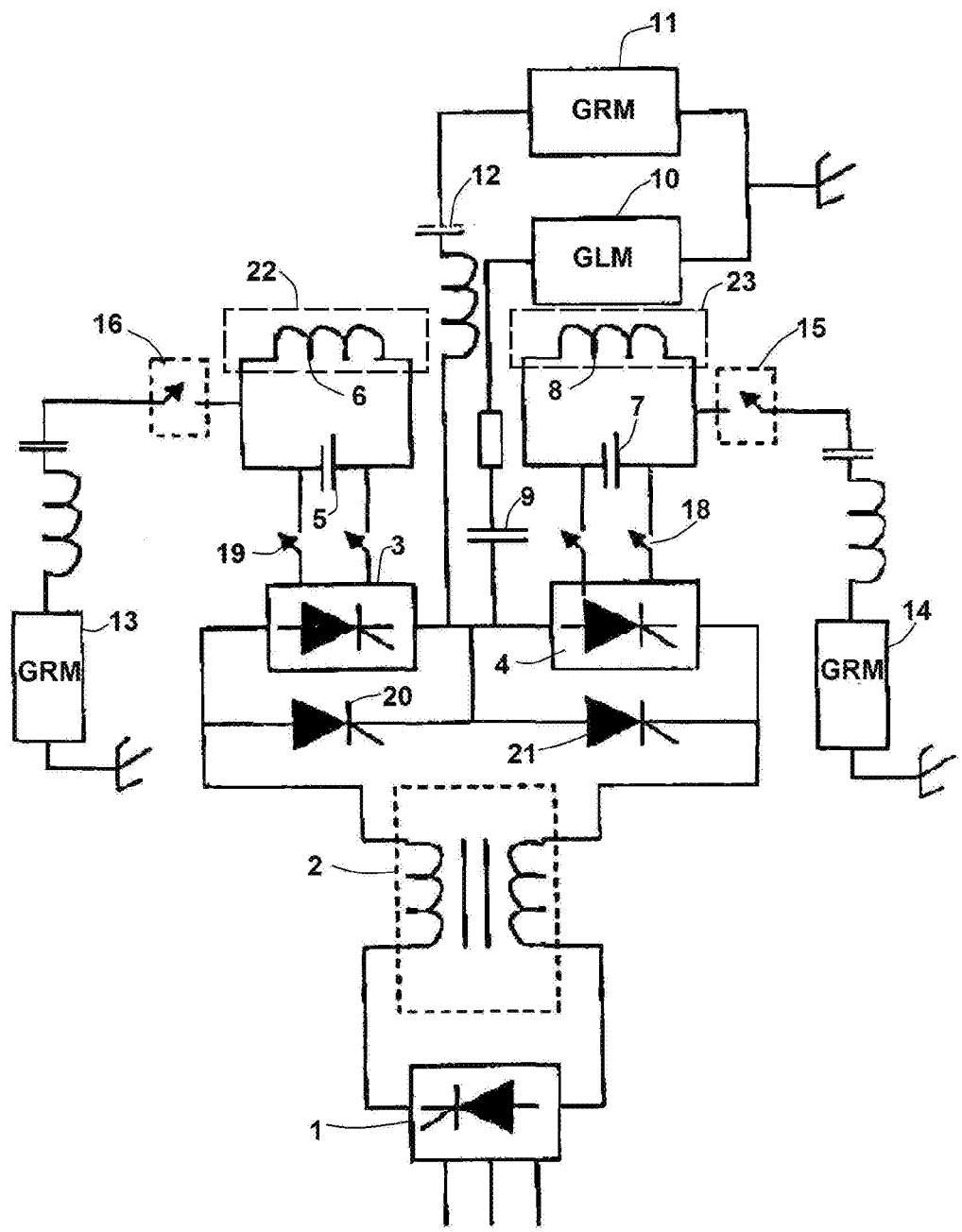

GROUND-FAULT DETECTOR FOR MULTIFURNACE INSTALLATION

CROSS REFERENCE TO RELATED APPLICATIONS

This application is the US-national stage of PCT application PCT/DE2013/000660 filed 7 Nov. 2013 and claiming the priority of German patent application 102012021903.2 itself filed 2 Nov. 2012 and German patent application 102013002796.9 itself filed 19 Feb. 2013.

FIELD OF THE INVENTION

The present invention is directed to an apparatus for the detection of ground faults in a multifurnace installation with at least two induction furnaces each having a respective induction-furnace coil forming part of one of at least two series or parallel connected resonant load circuits, with at least two parallel or series connected inverters supplying respective resonant load circuits and operatively connected to a common rectifier connected to an AC current source, a ground-fault sensor associated with each induction furnace and connected to the electrical supply line to the induction-furnace coil, and a ground-leak sensor connected to the at least two inverters.

BACKGROUND OF THE INVENTION

The detection of a ground fault at an early point of time is an important measure in connection with such a multifurnace installation with several induction furnaces in order to improve the operational security of such a multifurnace installation. For this, ground-fault detecting means are used. With these means a measurement is carried out according to which a resistance value is ascertained by means of an own current source. An analogous output signal of the apparatus can be visualized by means of a pointer instrument and a programmable threshold can generate an alarm message.

Furthermore, such ground faults can be detected through a ground-leak sensor by means of a ground-leak sensor. Here, a passive measurement is carried out according to which the current flowing to ground is measured through a current transformer. An analogous output signal of the corresponding apparatus can be visualized by means of a pointer instrument and an adjustable threshold can generate an alarm message.

In the above-described apparatus of the prior art a ground-fault sensor associated with each induction furnace and connected to the electrical supply line to the induction-furnace coil as well as a ground-leak sensor connected to the at least two inverters are used. The furnace-related ground-fault sensors have to be switched off in such an apparatus as soon as at least one furnace is operated since they influence toward each other so that a satisfying release is not possible. Then, the ground-leak sensor takes over the function of detecting a ground fault. A furnace isolated from the power supply is further monitored by the ground-fault sensor since the same is not switched off with a separated furnace. If special requirements for instance a too wet crucible) exist the ground-fault sensor has to be deactivated with a key switch in order to be able to operate the corresponding furnace.

The provided ground-leak sensor enables a quick reaction on defects caused by electrical sparkovers arcing). Here, the leakage current is measured by means of a current detector wherein the detector lets pass high frequency current that is typically associated with arcing caused by insulation breakdown in the induction furnace refractory or the insulation that surrounds the coil while rejecting lower frequency voltage components. If the arcing current exceeds a preset threshold a trip signal is generated to shut down the furnace and an alarm is provided to signal the ground leakage fault to the furnace operator. Preferably, the furnace is switched off. However, one came to know that the ground-leak sensor does not operate in a satisfying manner in each case with small furnace voltages.

OBJECT OF THE INVENTION

It is the object of the present invention to provide an apparatus of the above-cited kind with which the security of a multifurnace installation can be further improved.

SUMMARY OF THE INVENTION

According to the invention this object is attained with an apparatus of the above-described type having the inventive feature that the apparatus includes an additional ground-fault sensor measuring at the same location as the ground-leak sensor.

Such an additional ground-fault sensor measuring at the same location as the ground-leak sensor ground-leak sensor) reacts also with small voltages in a satisfying manner but operates in an integrating manner so that a ground fault can be detected only with delay. However, the simultaneous use of a ground-fault sensor and a ground-leak sensor provided according to the invention represents a significant improvement of security since the ground-fault sensor functions independently of the furnace voltage while the ground-leak sensor is characterized by a quick reaction.

As regards the design of the additional ground-fault sensor, preferably, the same injects as ground resistance monitor an AC current of low frequency into the furnace circuit and measures the magnitude of this low frequency current. The magnitude of this low frequency current is proportional with respect to the whole ground resistance of the furnace system. If the ground resistance drops below a preset threshold a trip signal is generated and an alarm is produced in order to show the ground resistance fault to the furnace operator. Preferably, the furnace is switched off.

Preferably, the invention is directed to an embodiment according to which two induction furnaces each have a respective resonant load circuit that is supplied by a respective inverter wherein the ground-leak sensor and the additional ground-fault sensor are connected between the two inverters.

Preferably, such a tandem system includes two induction furnaces and two capacitor batteries connected in parallel to the furnaces and forming the resonant load circuit parallel resonant circuit) together with the inductivity of the furnace coil. The current supply is realized by means of two inverters that, connected in series, operate with a common rectifier and possibly an intermediate circuit. Preferably, the inverter outputs to the resonant load circuit are switchable in order to isolate a defective furnace from the system and thus to be able to continue to operate with the remaining furnace. Each furnace is associated with a ground-fault sensor that is directly connected to the electrical supply line to the furnace coil.

According to a special embodiment the at least two induction furnaces use current from a common current supply with power sharing.

Preferably, the ground-leak sensor AC current ground-leak sensor) has a R/C circuit. Here, the capacitor passes high frequency current that, as mentioned, typically is associated with arcing.

Preferably, the ground-fault sensors associated with each induction furnace and connected to the electrical supply line to the induction-furnace coil are adapted to be switched off when the furnaces are switched on and are adapted to be switched on when the furnaces are switched off. For this, suitable relays are used. By this, an individual indication of the ground resistance to the respective induction furnaces is enabled. If one furnace or if both furnaces are switched off the furnaces are isolated from one another by their respective inverters so that the ground resistance of each furnace can be individually indicated.

If a ground fault exists in a furnace the same has to be isolated in order to be able to continue the operation of the other furnace. For this purpose the invention provides switches for isolating the load circuit of the respective induction furnaces from the corresponding inverters, especially contactors. In addition to the contactors bypass thyristors can be provided wherein the respective defective furnaces can be isolated by switching on the bypass thyristor and switching off the corresponding inverter.

When the ground-fault sensor is deactivated it is not possible to monitor both furnaces of a system having two furnaces in a satisfying manner. As soon as two furnaces of such a system are simultaneously operated a common resistance to ground is established. If it is necessary to deactivate a ground-fault sensor because the isolation resistance to ground is very low for instance by a wet newly supplied crucible) the second furnace that is simultaneously operated cannot be monitored in a satisfying manner. Accordingly, it would not be possible to detect a ground fault from bath to the coil.

As soon as the ground-fault sensor of a furnace is deactivated the control of this system prohibits the simultaneous operation of two furnaces. Accordingly, in order to be able to switch on a furnace the isolating switch of the respective other furnace has to be opened.

In systems with automated furnace isolating switches the handling is simplified in that the operator has only to switch on the desired furnace as usual. Then the control of the system isolates the respective other furnace from the system prior to the real switching on.

Furthermore, the invention relates to a furnace system including at least two induction furnaces each having an induction-furnace coil that defines a part of one of at least two series or parallel connected resonant load circuits, at least two parallel or series connected inverters each supplying a resonant load circuit and operatively connected to a common rectifier connected to an AC current source, and an apparatus for detecting ground faults with a ground-fault sensor associated with each induction furnace and connected to the electrical supply line to the induction-furnace coil, a ground-leak sensor connected to the at least two inverters, and an additional ground-fault sensor measuring at the same location as the ground-leak sensor.

BRIEF DESCRIPTION OF THE DRAWING

In the following the invention is described in detail by means of an example in connection with the drawing whose sole FIGURE shows schematically the construction of a multifurnace installation with ground-fault detection.

SPECIFIC DESCRIPTION OF THE INVENTION

The FIGURE shows a multifurnace installation with two induction furnaces indicated schematically at 22 and 23 and using current from a common current supply with power sharing. According to this system a 3-phase AC line voltage from the utility network is applied to a rectifier 1. The rectifier 1 converts the 3-phase AC line voltage to a DC voltage. The DC voltage from the rectifier 1 flows through an inductor 2 that reduces ripple in the DC current. Then the DC current from the inductor 2 flows through two inverters 3 and 4. Each inverter 3 and 4 drives a respective resonant load circuit comprising a capacitor 5 and an induction-furnace coil 6 for the furnace 22 that is operatively associated with the inverter 3, and a capacitor 7 together with an induction-furnace coil 8 that is operatively associated with the inverter 4 and part of the furnace 23.

The circuit configuration shown in the drawing is a power-sharing power supply according to which two induction furnaces 22 and 23 can share the available power from the common power supply 1, 2 in any desired proportion. It should be understood that the present invention is equally applicable to series or parallel connected load circuits and series or parallel connected inverters operatively associated with a common rectifier.

The system includes ground-fault detecting means 13, 14 that are operatively connected to their respective induction-furnace coils 6 and 8. These ground-fault detecting means 13 and 14 are switched off by relays 15 and 16 when the respective furnaces 22 and 23 are switched on and are again switched on when the furnaces 22 and 23 are switched off so that they report an individual indication of the ground resistance to their respective induction furnaces 22 of 23. If one or both of the furnaces 22 and 23 are switched off, they are isolated from one another by their respective inverters 3 and 4 so that the ground resistance of each furnace can be individually determined.

Furthermore, switches 18, 19 are provided in order to isolate the load circuits of the respective induction furnaces 22 and 23 from the respective inverters 3 and 4. That is, if a ground fault exists in one furnace it has to be isolated in order to be able to continue the operation of the other furnace. In addition to the switches 18, 19, bypass thyristors 20 and 21 can be provided so that the respective defective furnace 22 of 23 can be isolated by switching on the respective bypass thyristor 20 or 21 and switching off the corresponding inverter 3 or 4.

Furthermore, the apparatus includes a ground-leak sensor (AC current ground-leak sensor) 10 that measures the leakage current through a R/C circuit 9. Its capacitor passes high frequency current typically associated with arcing and caused by insulation breakdown in the induction furnace refractory or the insulation that surrounds the coil while rejecting lower frequency voltage components. If the arcing current exceeds a preset threshold a trip signal is generated to shut down the furnaces 22 and 23 and an alarm is provided to signal the ground leakage fault to the furnace operator.

Moreover, the apparatus has a ground-fault sensor (ground resistance monitor) 11 injecting an AC current of low frequency through a choke 12 into the furnace circuit. The magnitude of this low-frequency current that is proportional to the total resistance to ground of the furnace system is measured by ground-fault measuring. When the resistance to ground drops below a preset threshold, a trip signal is generated to shut down the furnaces 22 and 23 and provide an alarm to signal the ground resistance fault to the furnace operator.

Accordingly, the ground-leak sensor 10 and the ground-fault sensor 11 are used in combination. Since the ground-fault sensor 11 functions independently of the furnace voltage while the ground-leak sensor 10 is characterized by a quick reaction, an improvement of security is obtained.

The invention claimed is:

1. An installation comprising:
   two induction furnaces,
   two respective resonant load circuits each including a respective induction-furnace coil in a respective one of the furnaces,
   two respective parallel or series connected inverters that are connected to and each supply a respective one of the resonant load circuits,
   a respective electrical supply line connecting each of the parallel or series connected inverters to a common rectifier connected to an AC current source,
   a respective ground-fault sensor associated with each induction furnace and connected to the respective electrical supply line and to the respective induction-furnace coil,
   a ground-leak sensor connected to the inverters, and
   an additional ground-fault sensor measuring at the same location as the ground-leak sensor and injecting an AC current of low frequency into the furnace circuit and measuring the magnitude of this low-frequency circuit.

2. The installation according to claim 1, wherein the ground-leak sensor s and the additional ground-fault sensor are connected to the inverters.

3. The installation according to claim 1, wherein the two induction furnaces use current from a common power-sharing power supply.

4. An installation comprising:
   two induction furnaces,
   two respective resonant load circuits each including a respective induction-furnace coil in a respective one of the furnaces,
   two respective parallel or series connected inverters that are connected to and each supply a respective one of the resonant load circuits,
   a respective electrical supply line connecting each of the parallel or series connected inverters to a common rectifier connected to an AC current source,
   a respective ground-fault sensor associated with each induction furnace and connected to the respective electrical supply line and to the respective induction-furnace coil,
   a ground-leak sensor having R/C circuit and connected to the inverters, and
   an additional ground-fault sensor measuring at the same location as the ground-leak sensor.

5. The installation according to claim 4, wherein the additional ground-fault sensor as ground resistance monitor injects an AC current of low frequency into the furnace circuit and measures the magnitude of this low frequency current.

6. An installation comprising:
   two induction furnaces,
   two respective resonant load circuits each including a respective induction-furnace coil in a respective one of the furnaces,
   two respective parallel or series connected inverters that are each connected to a respective one of the resonant load circuits and that each supply a respective one of the resonant load circuits,
   a respective electrical supply line connecting each of the parallel or series connected inverters to a common rectifier connected to an AC current source,
   a respective ground-fault sensor associated with each induction furnace and connected to the respective electrical supply line and to the respective induction-furnace coil,
   a ground-leak sensor connected to the inverters,
   an additional ground-fault sensor measuring at the same location as the ground-leak sensor, and
   respective switches for isolating the load circuits of the respective induction furnaces from the corresponding inverters.

7. An installation comprising:
   two induction furnaces;
   two respective resonant load circuits each including a respective induction-furnace coil each in a respective one of the furnaces,
   two respective parallel or series connected inverters that are each connected to and that each supply a respective one of the resonant load circuits,
   a respective electrical supply line connecting each of the parallel or series connected inverters to a common rectifier connected to an AC current source,
   a respective ground-fault sensor associated with each induction furnace and connected to the respective electrical supply line and to the respective induction-furnace coil,
   a ground-leak sensor connected to the inverters, and
   an additional ground-fault sensor measuring at the same is location as the ground-leak sensor and having switches by means of which they are switchable on and off.

8. A multifurnace installation comprising
   two induction furnaces each having a respective induction-furnace coil that defines a part of a respective one of two series or parallel connected resonant load circuits,
   two parallel or series connected inverters each connected to and supplying a respective one of the resonant load circuits and operatively connected to a common rectifier that is connected to an AC current source, and
   an apparatus for detecting ground faults, the apparatus comprising
      a respective ground-fault sensor associated with each induction furnace and connected to the respective electrical supply line and to the respective induction-furnace coil,
      a ground-leak sensor connected to the two inverters, and
      an additional ground-fault sensor measuring at the same location as the ground-leak sensor and acting as ground resistance monitor by injecting an AC current of low frequency into the furnace circuit and measuring the magnitude of this low-frequency current.

* * * * *